(12) United States Patent
Chen et al.

(10) Patent No.: US 10,256,808 B2
(45) Date of Patent: Apr. 9, 2019

(54) BANDGAP REFERENCE CIRCUIT HAVING CLAMPING CONTROL CIRCUIT AND BEING CAPABLE OF IMPROVING RATE OF PROVIDING PREDETERMINED VOLTAGE

(71) Applicant: RichWave Technology Corp., Taipei (TW)

(72) Inventors: Chih-Sheng Chen, Taipei (TW); Tien-Yun Peng, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/825,116

(22) Filed: Nov. 29, 2017

(65) Prior Publication Data

US 2018/0323780 A1    Nov. 8, 2018

(30) Foreign Application Priority Data

May 2, 2017   (TW) .............................. 106114464 A

(51) Int. Cl.
| | |
|---|---|
| *G05F 3/18* | (2006.01) |
| *G05F 3/30* | (2006.01) |
| *G05F 3/22* | (2006.01) |
| *G05F 1/46* | (2006.01) |
| *H03K 17/22* | (2006.01) |
| *G11C 5/14* | (2006.01) |
| *G05F 3/26* | (2006.01) |

(52) U.S. Cl.
CPC ............ *H03K 17/22* (2013.01); *G05F 1/468* (2013.01); *G05F 3/18* (2013.01); *G05F 3/26* (2013.01); *G11C 5/147* (2013.01)

(58) Field of Classification Search
CPC ... G05F 3/18; G05F 3/30; G05F 3/225; G05F 3/227; G05F 1/468; G05F 1/46; G11C 5/147

See application file for complete search history.

(56) References Cited

U.S. PATENT DOCUMENTS 5,689,460 A * 11/1997 Ooishi .................. G11C 5/143
                                                                    327/530
5,847,597 A * 12/1998 Ooishi .................. G11C 5/143
                                                                    327/543

(Continued)

FOREIGN PATENT DOCUMENTS

| TW | 201401012 A | 1/2014 |
|---|---|---|
| TW | 201633683 A | 9/2016 |
| WO | 2017/041691 A1 | 3/2017 |

*Primary Examiner* — Timothy J Dole
*Assistant Examiner* — Sisay G Tiku
(74) *Attorney, Agent, or Firm* — Winston Hsu

(57) ABSTRACT

A bandgap reference circuit includes a voltage generation circuit, a capacitor and a clamping control circuit. The voltage generation circuit is used to generate a current on an operation terminal. The capacitor includes a first terminal coupled to the operation terminal, and a second terminal coupled to a first reference voltage terminal. The clamping control circuit is coupled between the operation terminal and a second reference voltage terminal. The clamping control circuit includes a switch and a clamping unit, and is used to allow part of the current flowing through the clamping unit to the second reference voltage terminal when the switch is turned on.

18 Claims, 9 Drawing Sheets

(56) References Cited

U.S. PATENT DOCUMENTS

| | | | | |
|---|---|---|---|---|
| 6,078,204 A * | 6/2000 | Cooper | ............... | B60T 8/268 |
| | | | | 327/309 |
| 6,703,813 B1 * | 3/2004 | Vladislav | ............... | G05F 1/575 |
| | | | | 323/270 |
| 7,088,059 B2 * | 8/2006 | McKinney | ......... | H05B 33/0818 |
| | | | | 315/291 |
| 7,423,476 B2 * | 9/2008 | Tang | ............... | G05F 3/262 |
| | | | | 327/309 |
| 7,659,705 B2 | 2/2010 | Hung | | |
| 8,525,774 B2 * | 9/2013 | Lin | ............... | H05B 33/0818 |
| | | | | 315/169.3 |
| 8,729,951 B1 | 5/2014 | Choy | | |
| 2003/0042882 A1 * | 3/2003 | Kawamura | ............ | G05F 3/267 |
| | | | | 323/312 |
| 2008/0136472 A1 * | 6/2008 | Shor | ............... | H03F 3/345 |
| | | | | 327/156 |
| 2009/0322235 A1 * | 12/2009 | Shiu | ............... | H05B 33/0845 |
| | | | | 315/185 R |
| 2009/0322252 A1 * | 12/2009 | Shiu | ............... | H03K 17/08142 |
| | | | | 315/297 |
| 2011/0175938 A1 * | 7/2011 | Lee | ............... | G09G 3/3406 |
| | | | | 345/690 |
| 2013/0200873 A1 * | 8/2013 | Wu | ............... | H02M 3/156 |
| | | | | 323/288 |
| 2014/0015509 A1 * | 1/2014 | Gupta | ............... | G05F 3/30 |
| | | | | 323/313 |
| 2014/0028193 A1 * | 1/2014 | Chiang | ............ | H05B 33/0824 |
| | | | | 315/127 |
| 2015/0185747 A1 * | 7/2015 | Liu | ............... | G05F 1/565 |
| | | | | 323/268 |
| 2015/0293552 A1 * | 10/2015 | Motozawa | ............ | G05F 3/30 |
| | | | | 323/313 |

\* cited by examiner

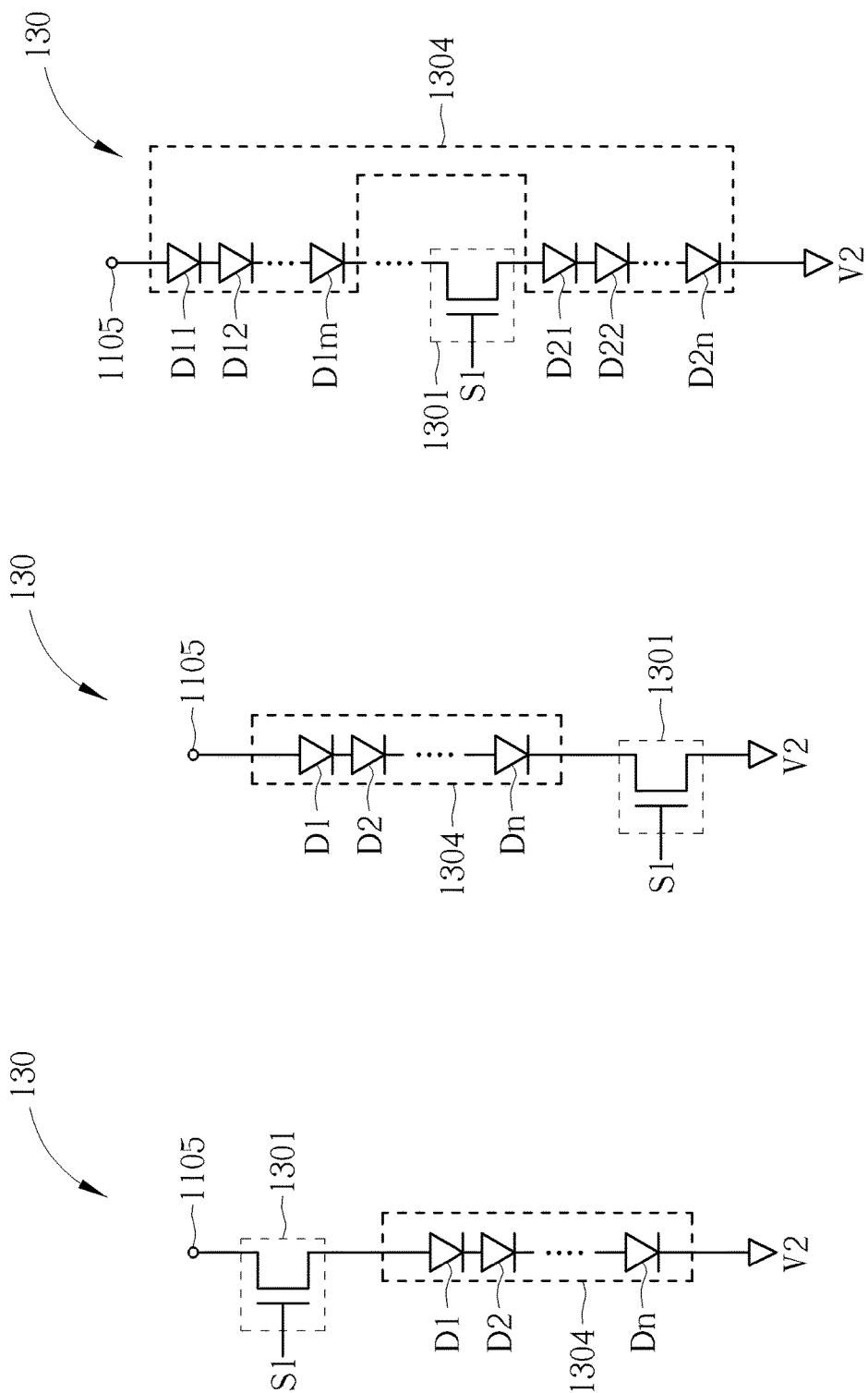

US 10,256,808 B2

BANDGAP REFERENCE CIRCUIT HAVING CLAMPING CONTROL CIRCUIT AND BEING CAPABLE OF IMPROVING RATE OF PROVIDING PREDETERMINED VOLTAGE

CROSS REFERENCE TO RELATED APPLICATION

This application claims priority to Taiwan Patent Application No. 106114464, filed May 2, 2017, and incorporated herein by reference in its entirety.

TECHNICAL FIELD

The present invention relates to a bandgap reference circuit, and more particularly, a bandgap reference circuit having a clamping control circuit and being able to improve a rate of providing a predetermined voltage.

BACKGROUND

In the field of circuit design, a bandgap reference circuit is widely used for providing a predetermined voltage. The advantages include low power consumption, stable output voltage, and so on. A bandgap reference circuit usually provides a reference voltage without being affected by temperature by adjusting a voltage across an internal transistor and a current across an internal resistor. Hence, a bandgap reference circuit acts as a voltage source of a voltage regulator.

However, it has to wait a long time for the voltage provided by a present bandgap reference circuit to reach a predetermined value. For example, when a bandgap reference circuit and a linear-drop-out (LDO) regulator are coupled to one another, unwanted noise caused by clock signals generated by the LDO regulator is fed to the bandgap reference circuit. In order to resist and filter out the noise, a larger resistor-capacitor (RC) circuit can be coupled between the bandgap reference circuit and the LDO regulator. Moreover, for decreasing power consumption, a bandgap reference circuit can be designed to have a low leakage current, so the operation current is also low. The foresaid larger RC circuit and the low operation current lengthen the time for waiting an output terminal of the bandgap reference circuit to provide a predetermined voltage. The RC circuit needs more time to be charged. The long waiting time has been an engineering problem in the field.

SUMMARY

An embodiment of the present invention provides a bandgap reference circuit for providing a predetermined voltage to a linear regulator. The bandgap reference circuit includes a voltage generation circuit, a capacitor and a clamping control circuit and a control unit. The voltage generation circuit is used to generate the predetermined voltage and a first current at an operation terminal. The capacitor includes a first terminal coupled to the operation terminal, and a second terminal coupled to a first reference voltage terminal. The clamping control circuit is coupled between the operation terminal and a second reference voltage terminal and includes a first switch and a clamping unit coupled to the first switch. The control unit is used to control the first switch. When a difference of a voltage at the operation terminal and the predetermined voltage is larger than a threshold, the control unit turns on the first switch so that a voltage across the clamping unit is increased, at least a portion of the first current flows to the second reference voltage terminal through the clamping unit, and the voltage at the operation terminal approaches the predetermined voltage at a first rate. When the difference of the voltage at the operation terminal and the predetermined voltage is smaller than the threshold, the control unit turns off the first switch so that the portion of the first current stops flowing to the second reference voltage terminal through the clamping unit, and the voltage at the operation terminal approaches the predetermined voltage at a second rate lower than the first rate.

Another embodiment of the present invention provides a voltage generator including a voltage generation circuit, a capacitance device and a clamping control circuit. The voltage generation circuit is used to generate a predetermined voltage and a first current at an operation terminal. The capacitance device includes a first terminal coupled to the operation terminal, and a second terminal coupled to a first reference voltage terminal. The clamping control circuit is coupled between the operation terminal and a second reference voltage terminal and includes a first switch; and a clamping unit coupled to the first switch and used to allow a portion of the first current to flow between the operation terminal and the second reference voltage terminal through the clamping unit when the first switch is turned on.

Another embodiment of the present invention provides a voltage control method used on a voltage generator. The voltage generator includes a voltage generation circuit, a capacitance device and a clamping control circuit. The clamping control circuit includes a first switch and a clamping unit. The voltage generation circuit includes an operation terminal. The capacitance device includes a first terminal coupled to the operation terminal. The clamping control circuit is coupled to the operation terminal. The method includes generating a first current by the voltage generation circuit; turning on the first switch so that a portion of the first current flows through the clamping unit; and turning off the first switch to charge or discharge the capacitance device to adjust a voltage of the operation terminal.

BRIEF DESCRIPTION OF THE DRAWINGS

FIG. 6, FIG. 7 and FIG. 8 illustrate internal structures of the clamping control circuit according to various embodiments.

DETAILED DESCRIPTION

Figure 1:
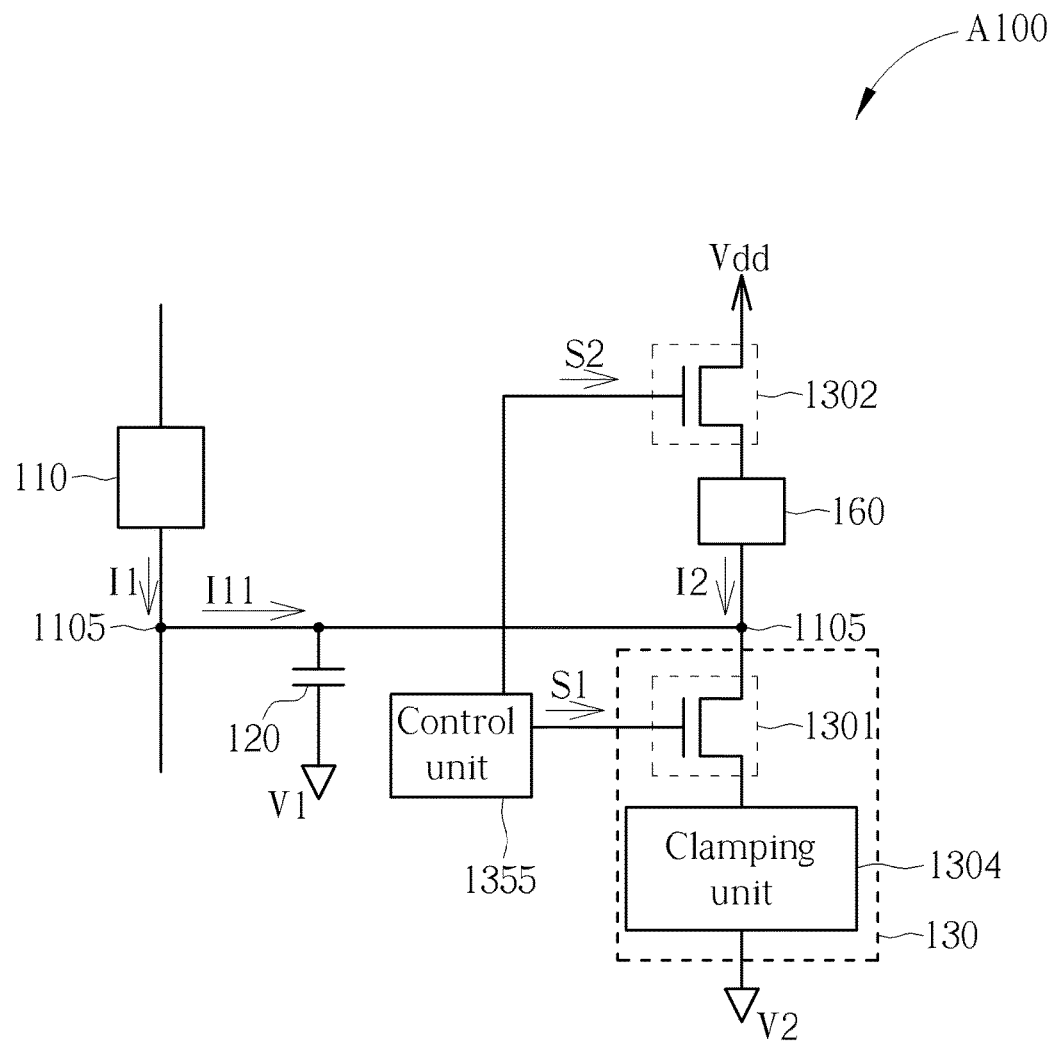
FIG. 1 illustrates a bandgap reference circuit according to an embodiment of the present invention.

Below, exemplary embodiments will be described in detail with reference to accompanying drawings so as to be easily realized by a person having ordinary knowledge in the art. The inventive concept maybe embodied in various forms without being limited to the exemplary embodiments set forth herein. Descriptions of well-known parts are omitted for clarity, and like reference numerals refer to like elements throughout.

FIG. 1 illustrates a bandgap reference circuit A100 according to an embodiment of the present invention. The bandgap reference circuit A100 may provide a predetermined voltage $V_{BG}$ to a linear-drop-out (LDO) regulator. The bandgap reference circuit may include a voltage generation circuit 110, a capacitor 120 and a clamping control circuit 130 and a control unit 1355. The voltage generation circuit 110 is used to generate the predetermined voltage $V_{BG}$ and a first current I1 at an operation terminal 1105. The capacitor 120 may include a first terminal coupled to the operation terminal 1105, and a second terminal coupled to a reference voltage terminal V1. The clamping control circuit 130 may be coupled between the operation terminal 1105 and a reference voltage terminal V2. The clamping control circuit 130 may include a switch 1301 and a clamping unit 1304 coupled to the switch 1301. The control unit 1355 may output a control signal S1 to control the switch 1301. In FIG. 1, the switch 1301 is coupled between the clamping unit 1304 and the operational terminal 1105 as an example, and the positions of the switch 1301 and the clamping unit 1304 may be exchanged. In other words, the clamping unit 1304 may be coupled between the switch 1301 and the operational terminal 1105 according to another embodiment.

During a first predetermined time interval, a difference of a voltage at the operation terminal 1105 and the predetermined voltage $V_{BG}$ is larger than a threshold, the control unit 1355 may turn on the switch 1301 so that a voltage across the clamping unit 1304 may be increased. At least a portion I11 of the first current I1 may flow between the operation terminal 1105 and the reference voltage terminal V2, for example, the first current I1 may flow to the reference voltage terminal V2 through the clamping unit 1304, and the voltage at the operation terminal 1105 may approach the predetermined voltage $V_{BG}$ at a first rate. During a second predetermined time interval, the difference of the voltage at the operation terminal 1105 and the predetermined voltage $V_{BG}$ is smaller than the threshold, the control unit 1355 may turn off the switch 1301 so that the portion of the first current I1 may stop flowing to the reference voltage terminal V2 through the clamping unit 1304. The voltage at the operation terminal 1105 may approach the predetermined voltage $V_{BG}$ at a second rate lower than the first rate.

According to an embodiment, the bandgap reference circuit A100 may further include a switch 1302 and a current control unit 160. The switch 1302 may be coupled to a source voltage terminal Vdd. The current control unit 160 may be coupled between the switch 1302 and the operation terminal 1105. The control unit 1355 may further output a control signal S2 to control the switch 1302. During the first predetermined time interval, the difference of the voltage of the operation terminal 1105 and the predetermined voltage $V_{BG}$ may be larger than the threshold, the control unit 1355 may turn on the switch 1302 so as to enable a current I2 flowing to the operation terminal 1105 from the source voltage terminal Vdd. During the second predetermined time interval, the difference of the voltage of the operation terminal 1105 and the predetermined voltage $V_{BG}$ is smaller than the threshold, the control unit 1355 may turn off the switch 1302 so as to terminate the current I2 flowing to the operation terminal 1105 from the source voltage terminal Vdd.

Figure 2:
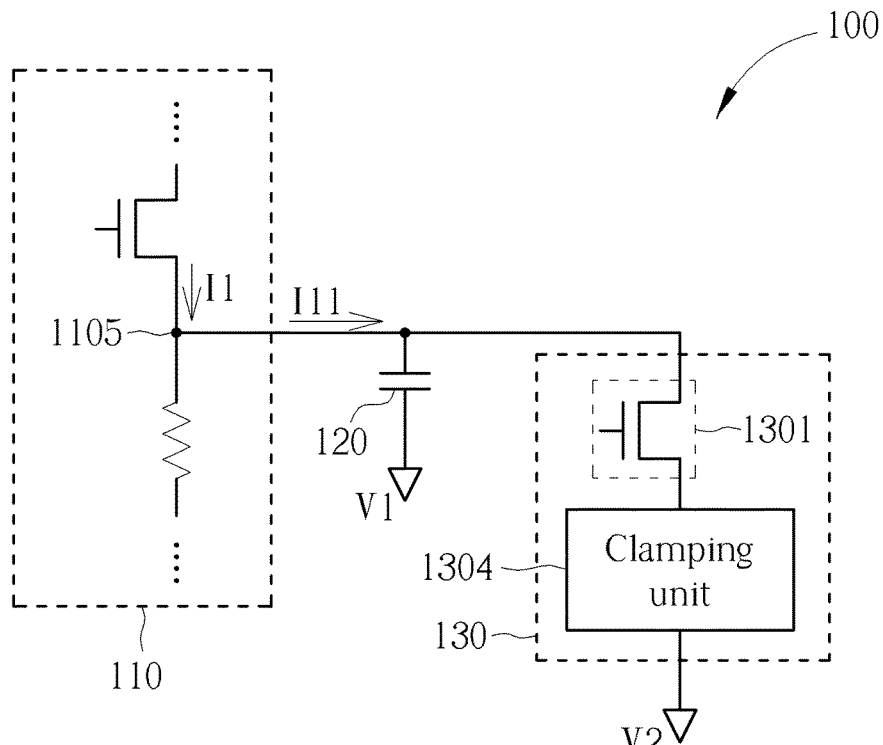
FIG. 2 illustrates a voltage generator according to another embodiment.

According to an embodiment, a bandgap reference circuit may act as a voltage generator. FIG. 2 illustrates a voltage generator 100 according to an embodiment. The voltage generator 100 may include a voltage generation circuit 110, a capacitance device (e.g. the capacitor 120 or another device being able to store electric charges) and a clamping control circuit 130. The voltage generation circuit 110 may generate a first current I1 at an operation terminal 1105. The capacitance device (e.g. the capacitor 120) may include a first terminal coupled to the operation terminal 1105, and a second terminal coupled to a reference voltage terminal V1, so that the capacitance device is able to store electric charges across the first terminal and the second terminal. The clamping control circuit 130 may be coupled between the operation terminal 1105 and a reference voltage terminal V2 and include a switch 1301 and a clamping unit 1304. The clamping unit 1304 may be coupled to the switch 1301 and allow a portion I11 of the first current I1 to flow to the reference voltage terminal V2 through the clamping unit 1304 when the switch 1301 is turned on. According to an embodiment, the reference voltage terminals V1 and V2 may have an identical voltage. The reference voltage terminals V1 and V2 may be (but not limited to) a ground terminal, a common terminal, or a return terminal. Acting as a bandgap reference circuit, the voltage generator 110 may provide the predetermined voltage $V_{BG}$ at the operational terminal 1105, and the predetermined voltage $V_{BG}$ may be substantially stable without being affected by temperature and used as a reference voltage of another electrical device (e.g. an LDO regulator).

Figure 3:
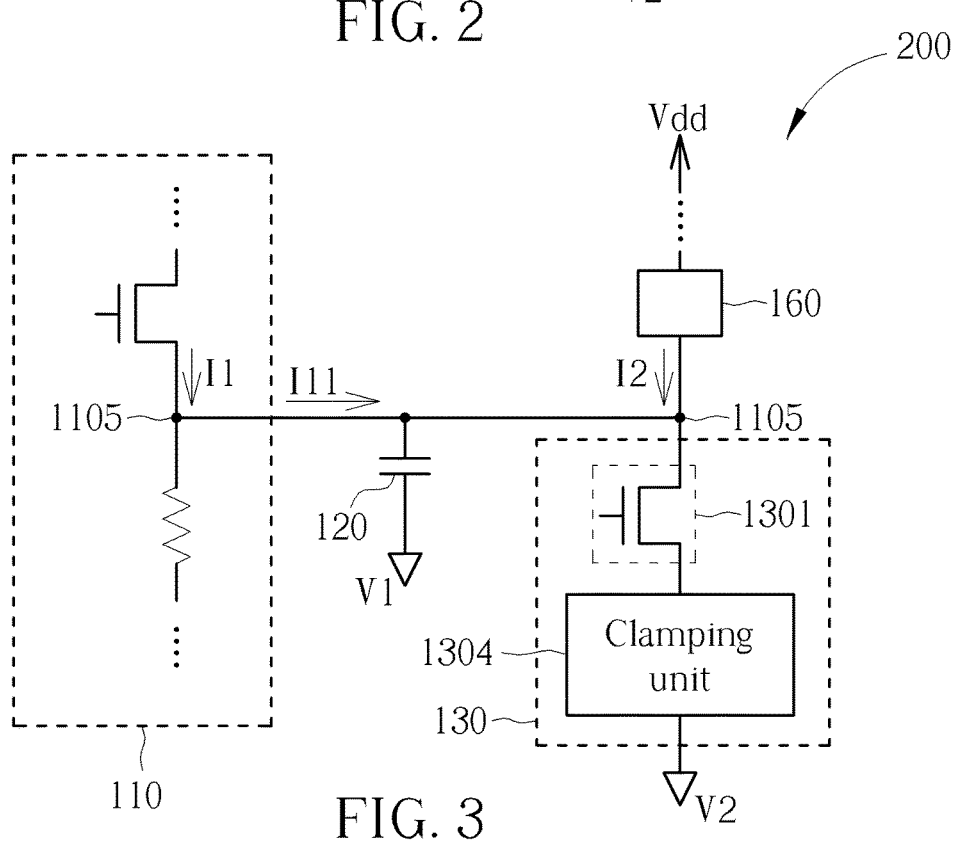
FIG. 3 illustrates a voltage generator according to another embodiment.

FIG. 3 illustrates a voltage generator 200 according to another embodiment. Comparing with the voltage generator 100 of FIG. 2, the voltage generator 200 may further include a current control unit 160. The current control unit 160 may be a resistor, or a part of a current mirror structure. The current control unit 160 may allow a current I2 to flow to the operation terminal 1105, and include a first terminal coupled to a source voltage terminal Vdd (e.g. a high voltage terminal) directly or indirectly, and a second terminal coupled to the operation terminal 1105.

Figure 4:
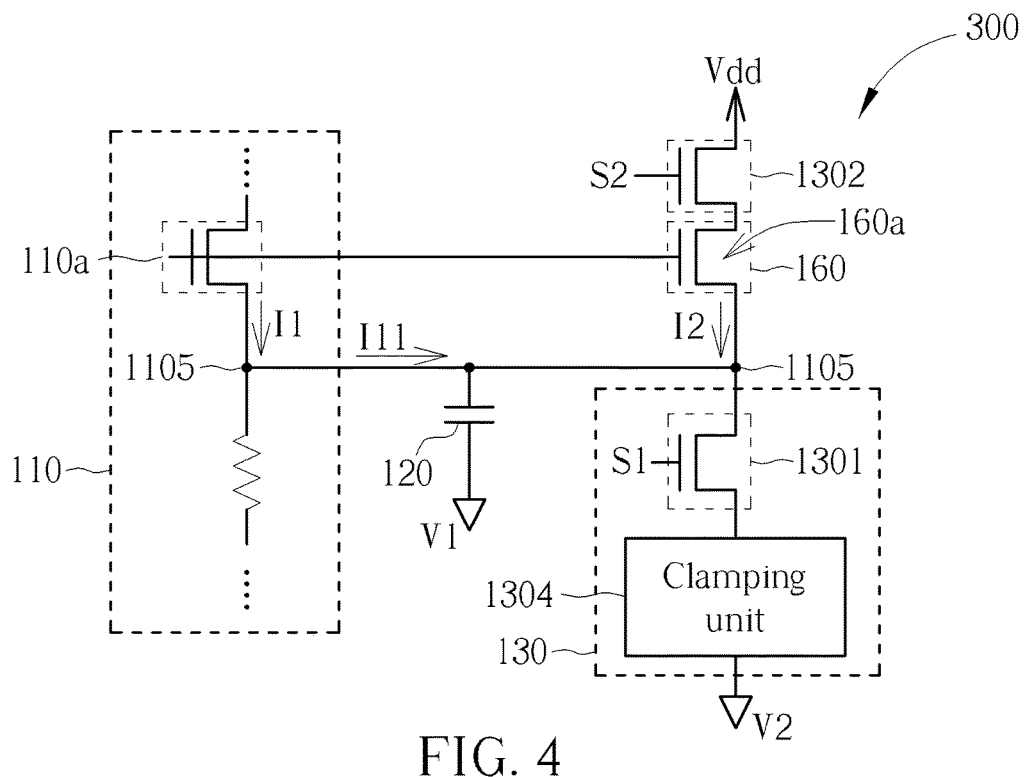
FIG. 4 illustrates a voltage generator according to another embodiment.

FIG. 4 illustrates a voltage generator 300 according to an embodiment. In FIG. 4, the current control unit 160 may include a transistor 160a. The voltage generator 300 may further include a switch 1302 coupled between the source voltage terminal Vdd and the first terminal of the current control unit 160. The switch 1302 may allow the current I2 to flow to the operational terminal 1105 from the source voltage terminal Vdd when the switch 1302 is turned on. In FIG. 4, the current I2 and a portion I11 of the current I1 may flow through the clamping unit 1304 when the switches 1301-1302 are turned on.

Figure 5:
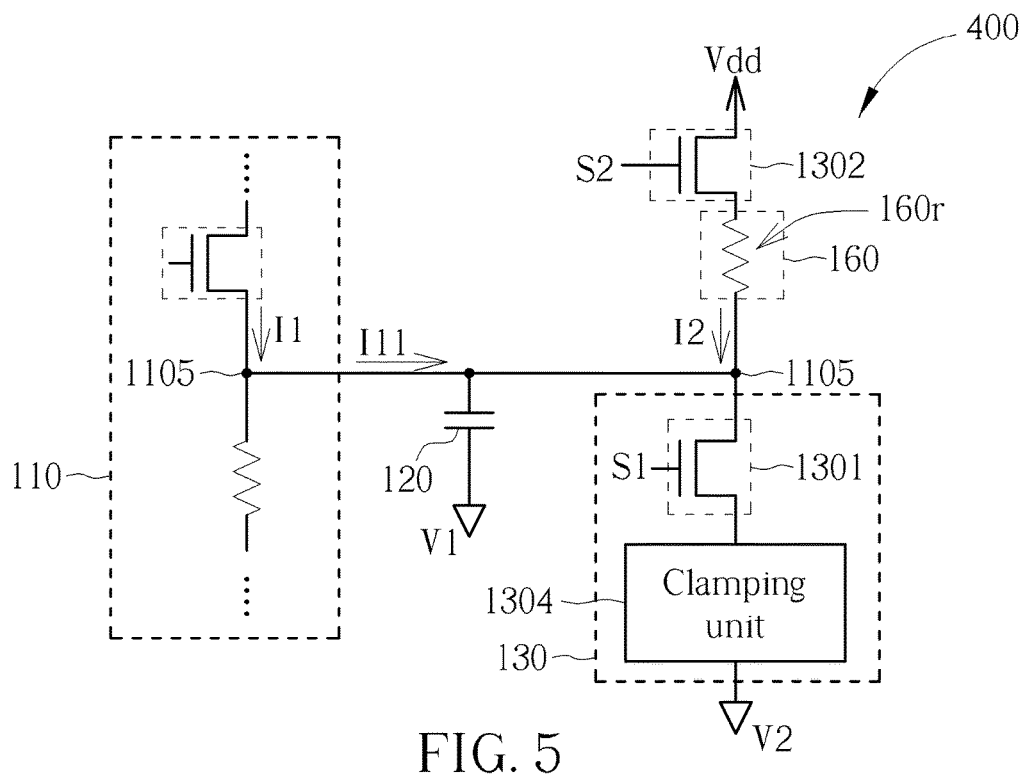
FIG. 5 illustrates a voltage generator according to another embodiment.

The switch 1301 may include a control terminal used to receive a control signal S1, and the switch 1302 may include a control terminal used to receive a control signal S2. The control signals S1 and S2 may be generated by a control circuit (e.g. the control unit 1355 of FIG. 1). The control signals S1 and S2 may turn on the switches 1301 and 1302 substantially at the same time during a first predetermined time interval, and turn off the switches 1301 and 1302 substantially at the same time during a second predetermined time interval. The time of turning on the switches 1301 and 1302 may correspond to whether a difference of a voltage at the operation terminal 1105 and a predetermined voltage is larger than a threshold. In FIG. 4, the transistor 160a of the current control unit 160 may include a control terminal coupled to the voltage generation circuit 110 so that the transistor 160a may generate the second current I2 according to the first current I1. For example, in the voltage generation circuit 110, the operation terminal 1105 may be coupled to a transistor 110a of the voltage generation circuit 110. As shown in FIG. 4, the control terminal of the transistor 160a of the current control unit 160 may be coupled to a control terminal of the transistor 110a to form a current mirror. According to the operation of the current mirror, the current I2 may be generated according to the current I1. FIG. 5 illustrates a voltage generator 400 according to another embodiment. In the voltage generator 400, the current control unit 160 may include a resistor 160r used to control the current value of the current I2 by selecting the resistance of the resistor 160r.

FIG. 6, FIG. 7 and FIG. 8 illustrate internal structures of the clamping control circuit 130 according to various embodiments. In FIGS. 1-4, the switch 1301 in the clamping control circuit 130 is coupled to the operation terminal 1105, and the clamping unit 1304 is coupled between the switch 1301 and the reference voltage terminal V2. However, FIGS. 6-8 may merely be examples without limiting the structure of the clamping control circuit 130. According to the embodiment of FIG. 6, the switch 1301 may have a first terminal coupled to the operation terminal 1105, and a second terminal. The clamping unit 1304 may include n diodes D1-Dn. The anode of a first diode D1 may be coupled to the second terminal of the switch 1301, and the cathode of an nth diode Dn may be coupled to the reference voltage terminal V2. The parameter n may be a positive integer. According to the embodiment of FIG. 7, the clamping unit 1304 may include n diodes D1-Dn. The anode of a first diode D1 may be coupled to the operation terminal 1105. The first terminal of the switch 1301 may be coupled to the cathode of an nth diode Dn, and the second terminal of the switch 1301 may be coupled to the reference voltage terminal V2. According to the embodiment of FIG. 8, the clamping unit 1304 may include a first set of diodes including m diodes D11-D1m, and a second set of diodes including n diodes D21-D2n. The anode of a first diode D11 of the first set of diodes maybe coupled to the operation terminal 1105. The first terminal of the switch 1301 may be coupled to the cathode of an $m_{th}$ diode D1m of the first set of diodes. The anode of a first diode D21 of the second set of diodes may be coupled to the second terminal of the switch 1301. The cathode of an $n_{th}$ diode D2n of the second set of diodes may be coupled to the reference voltage terminal V2. The parameters m and n may be positive integers. In other words, in the clamping control circuit 130, the switch 1301 and at least one diode may be coupled between the operation terminal 1105 and the reference voltage terminal V2. The sequence of coupling and the number of the diodes may be adjusted according to various requirements. The mentioned diode may be a device with clamping function such as a diode generated with a p-n junction, a Schottky diode, a light emitting diode, or a transistor connected as a diode.

Figure 9:
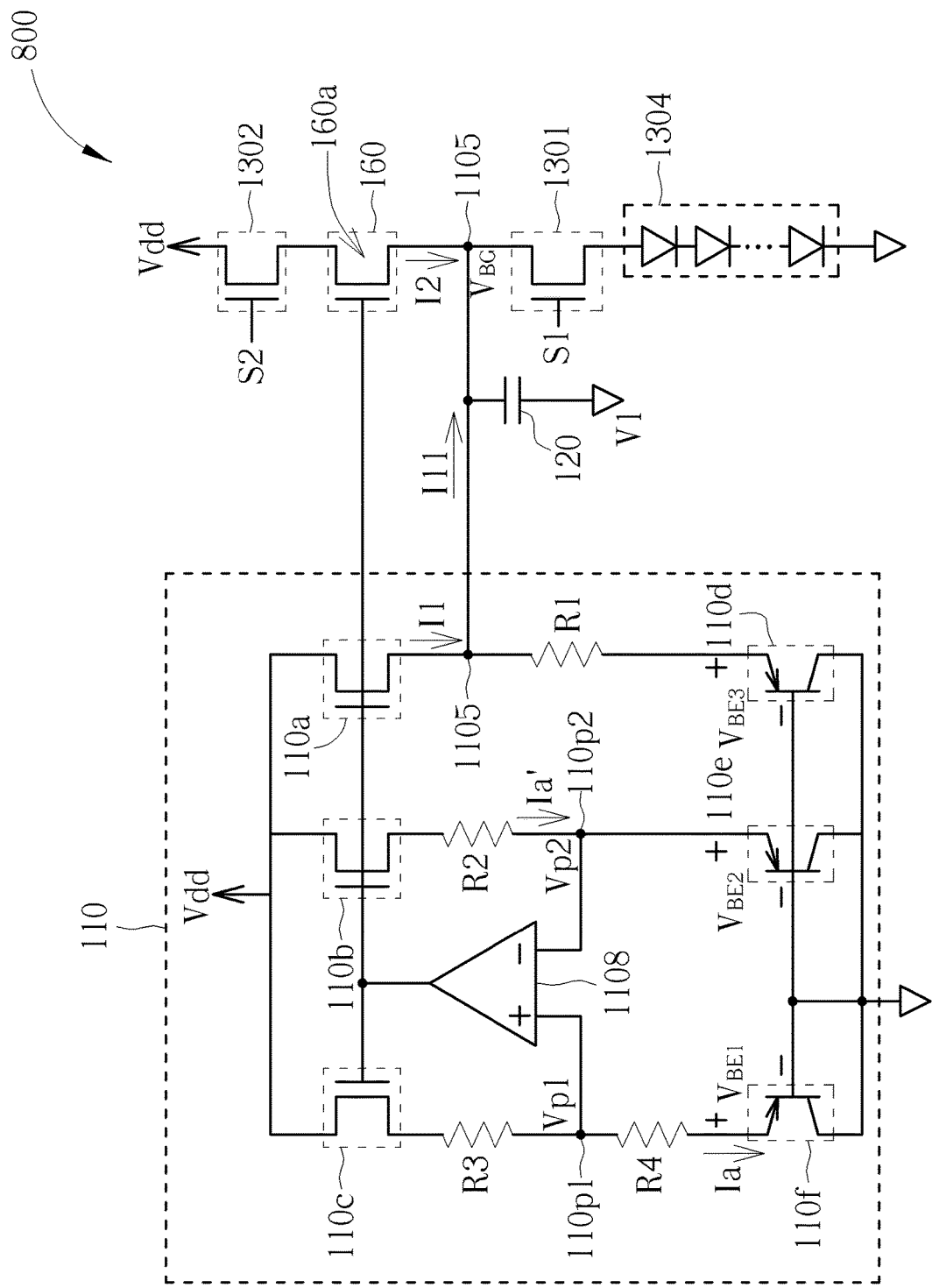
FIG. 9 illustrates a voltage generator according to another embodiment.

FIG. 9 illustrates a voltage generator 800 according to an embodiment. In FIG. 9, more details of the voltage generating circuit 110 are provided. FIG. 9 may exemplify a structure as a reference for circuit design rather than limiting the scope of the present invention. The voltage generators of the present invention are not limited by FIG. 9, and other reasonable structures are allowed according to other embodiments. The voltage generation circuit 110 of FIG. 9 may include transistors 110a to 110f, an amplifier 1108, resistors R1 to R4, and nodes 110p1 to 110p2. A voltage Vp1 at the node 110p1 may be identical to the voltage Vp2 at the node 110p2 substantially, so the equation Vp1=Vp2 may be obtained. A current Ia flowing through the resistor R4 may be identical to a current Ia' flowing between the node 110p2 and the transistor 110e. A base-emitter voltage of the transistor 110f may be $V_{BE1}$. A base-emitter voltage of the transistor 110e may be $V_{BE2}$. Because Vp1=Vp2, $V_{BE1}$+Ia× R4=$V_{BE2}$. Thus, $V_{BE2}$−$V_{BE1}$=Ia×R4. This equation may be expressed as $\Delta V_{BE}$=Ia×R4. Since the difference of voltage $\Delta V_{BE}$ may be proportional to absolute temperature (PTAT), the value of current Ia may be a positive temperature coefficient (PTC) and increases when the temperature increases. Regarding the predetermined voltage $V_{BG}$ at the operation terminal 1105, it may be expressed with the equation $V_{BG}$=$V_{BE3}$+I1×R1. The voltage $V_{BE3}$ is a base-emitter voltage of the transistor 110d, and the predetermined voltage $V_{BG}$ may be a voltage which will be provided at the operation terminal 1105. The current I1 may vary with the current Ia' according to the operation of a current mirror, so the value I1×R1 may be a positive temperature coefficient. Because the voltage $V_{BE3}$ may be a negative temperature coefficient (NTC) and decreases when the temperature increases, and the value I1×R1 may be a PTC, the predetermined voltage $V_{BG}$ may be stable substantially without being affected by temperature. However, it takes a waiting time for the voltage at the operation terminal 1105 to increase to be the predetermined voltage $V_{BG}$, so a voltage control method provided by an embodiment may be used to shorten the waiting time.

Figure 10:
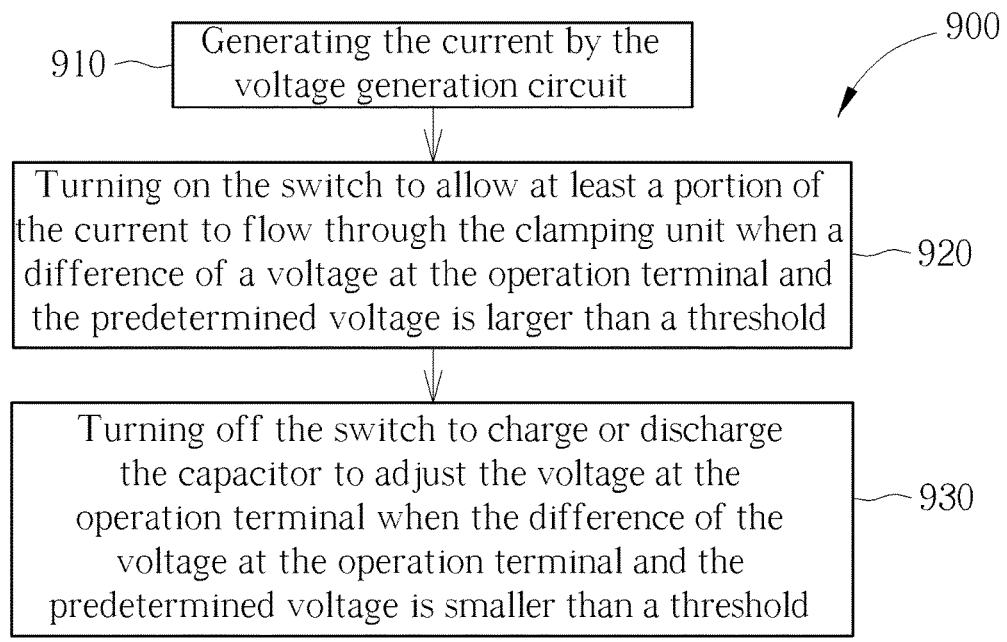
FIG. 10 illustrates a flowchart of a voltage control method according to an embodiment.

FIG. 10 illustrates a flowchart of a voltage control method 900 according to an embodiment. Regarding FIG. 2, the method 900 may include:

Step 910: generating the current I1 by the voltage generation circuit 110;

Step 920: turning on the switch 1301 to allow at least a portion I11 of the current I1 to flow through the clamping unit 1304 when a difference of a voltage at the operation terminal 1105 and the predetermined voltage $V_{BG}$ is larger than a threshold; and Step 930: turning off the switch 1301 to charge or discharge the capacitor 120 to adjust the voltage at the operation terminal 1105 when the difference of the voltage at the operation terminal 1105 and the predetermined voltage $V_{BG}$ is smaller than a threshold.

In Steps 920 and 930, the switch 1301 may be controlled to be on or off by control signals provided by a control unit. In Step 920, the portion I11 of the current I1 flowing through the clamping unit 1304 may increase the voltage across the clamping unit 1304 so as to pre-charge the voltage at the operation terminal 1105 to be approximate to the predetermined voltage $V_{BG}$. In Step 930, if the voltage at the operation terminal 1105 is pre-charged to be over the predetermined voltage $V_{BG}$, the capacitor 120 may be discharged to decrease to be the predetermined voltage $V_{BG}$. If the voltage at the operation terminal 1105 is still smaller than the predetermined voltage $V_{BG}$ after being pre-charged, the capacitor 120 maybe charged to reach the predetermined voltage $V_{BG}$. By increasing the voltage across the clamping unit 1304, the increasing of the voltage at the operation terminal 1105 is accelerated, reducing the waiting time.

Figure 11:
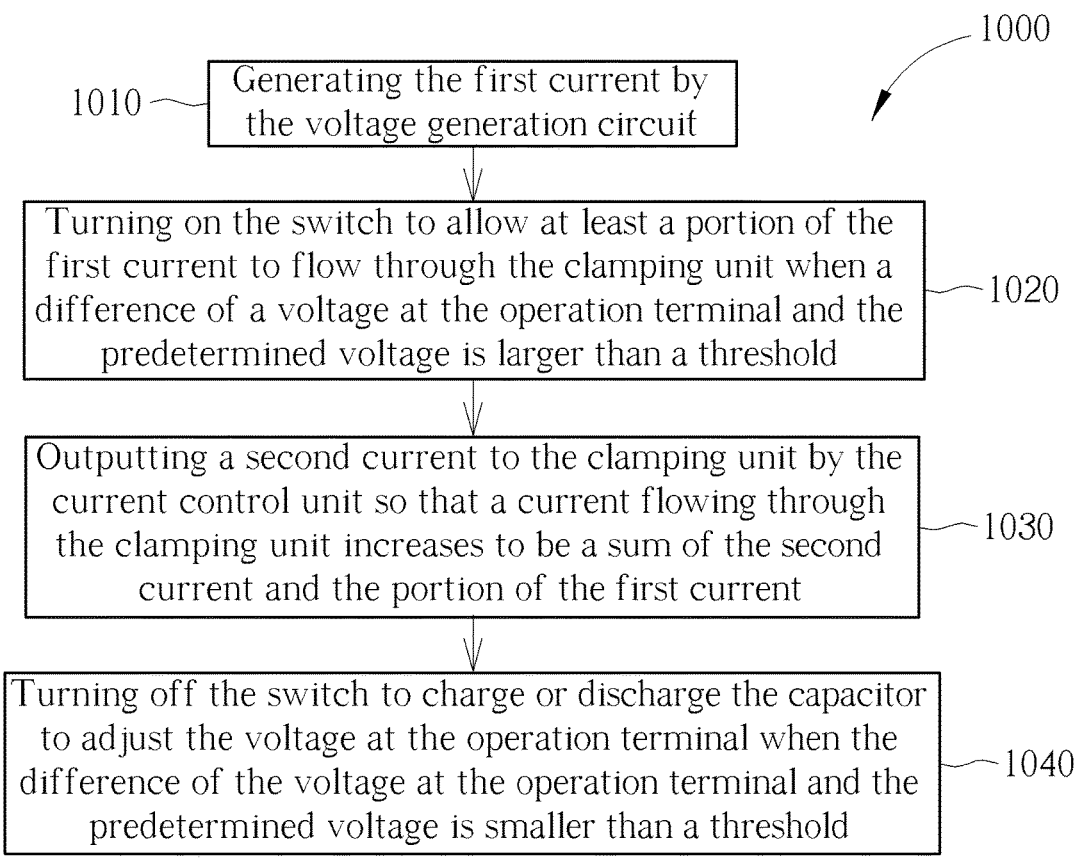
FIG. 11 illustrates a flowchart of a voltage control method according to another embodiment.

FIG. 11 illustrates a flowchart of a voltage control method 1000 according to an embodiment. Regarding FIG. 3, the method 1000 may include:

Step 1010: generating the current I1 by the voltage generation circuit 110;

Step 1020: turning on the switch 1301 to allow at least a portion I11 of the current I1 to flow through the clamping unit 1304 when a difference of a voltage at the operation terminal 1105 and the predetermined voltage $V_{BG}$ is larger than a threshold;

Step 1030: outputting a current I2 to the clamping unit 1304 by the current control unit 160 so that a current flowing through the clamping unit 1304 increases to be a sum of the current I2 and the portion I11 of the first current I1; and Step 1040: turning off the switch 1301 to charge or discharge the capacitor 120 to adjust the voltage at the operation terminal 1105 when the difference of the voltage at the operation terminal 1105 and the predetermined voltage $V_{BG}$ is smaller than a threshold.

Comparing with the method 900, the Step 1030 of the method 1000 may accelerate the clamping of the clamping unit 1304 using the current I2. The rate of the increasing the voltage at the operation terminal 1105 may be enhanced, and the waiting time may be reduced. When the current control unit 160 includes the transistor 160a, and the transistor 160a forms a current mirror with the transistor 110a (as shown in FIG. 4), the current I2 may vary with the current I1. When the current control unit 160 is the resistor 160r (as shown in FIG. 5), the current I2 may be adjusted by selecting the resistor 160r.

Figure 12:
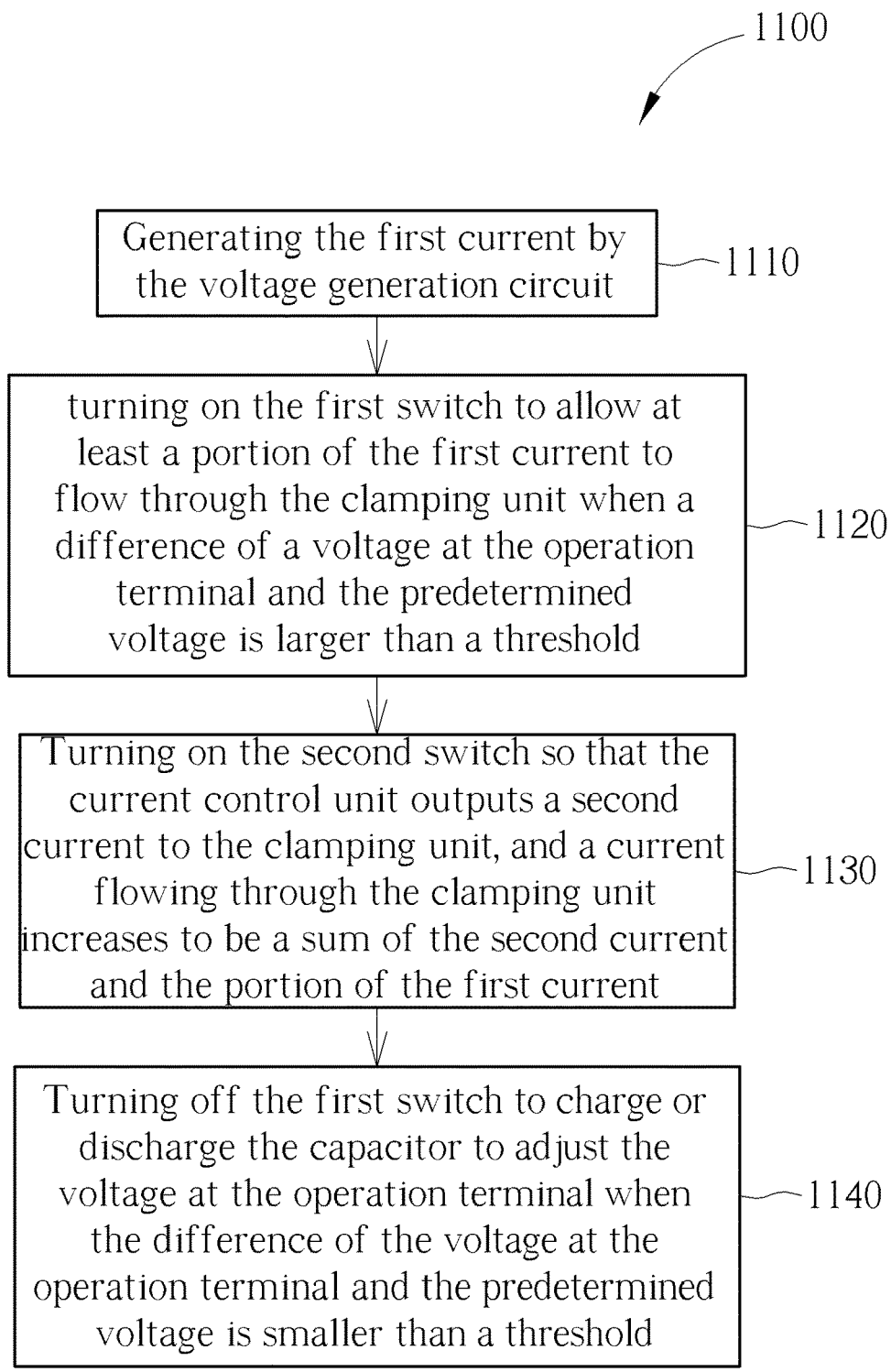
FIG. 12 illustrates a flowchart of a voltage control method according to another embodiment.

FIG. 12 illustrates a flowchart of a voltage control method 1100 according to an embodiment. Regarding FIGS. 3, 4, 5 and 9, the method 1100 may include:

Step 1110: generating the current I1 by the voltage generation circuit 110;

Step 1120: turning on the switch 1301 to allow at least a portion I11 of the current I1 to flow through the clamping unit 1304 when a difference of a voltage at the operation terminal 1105 and the predetermined voltage $V_{BG}$ is larger than a threshold;

Step 1130: turning on the switch 1302 so that the current control unit 160 outputs a current I2 to the clamping unit 1304, and a current flowing through the clamping unit 1304 increases to be a sum of the current I2 and the portion I11 of the current I1; and Step 1140: turning off the switch 1301 to charge or discharge the capacitor 120 to adjust the voltage at the operation terminal 1105 when the difference of the voltage at the operation terminal 1105 and the predetermined voltage $V_{BG}$ is smaller than a threshold.

Comparing with the method 1000, in the Step 1130 of the method 1100, the current I2 may be controlled whether to flow through the clamping unit 1304 by turning the switch 1302 on or off. The controllability of the circuit may be improved. The switches 1301 and 1302 may be turned on substantially at the same time during a first predetermined time interval. In Step 1140, the switches 1301 and 1302 may be turned off substantially at the same time during a second predetermined time interval.

Figure 13:
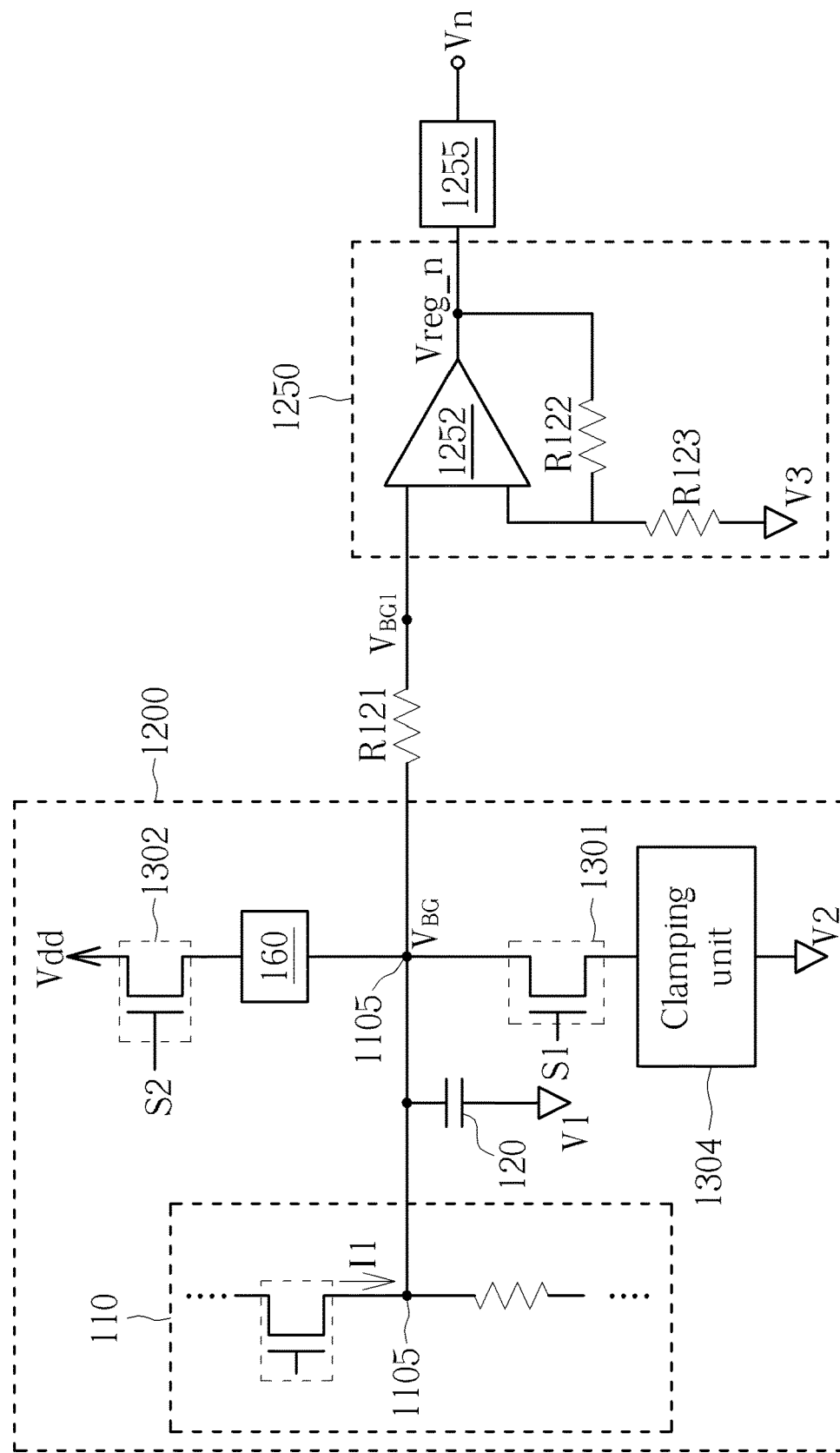
FIG. 13 illustrates the application of a voltage generator according to an embodiment.

FIG. 13 illustrates the application of a voltage generator 1200 according to an embodiment. The voltage generator 1200 may act as a bandgap reference circuit. Each functional block of the voltage generator 1200 is described above, so it is not interpreted repeatedly. The operation terminal 1105 of the voltage generator 1200 may be coupled to a resistor R121, and the resistor R121 may provide a voltage $V_{BG1}$ when the voltage at the operation terminal 1105 reaches the predetermined voltage $V_{BG}$. The resistor R121 may be coupled to an LDO regulator 1250. In the LDO regulator 1250, a first terminal of an operational amplifier 1252 may be coupled to the resistor R121, so the resistor R121 may be coupled between the operation terminal 1105 and the first terminal of an operational amplifier 1252. A resistor R123 may be coupled between a second terminal of the operational amplifier 1252 and a reference voltage terminal V3. A resistor R122 may be coupled between the second terminal of the operational amplifier 1252 and an output terminal of the operational amplifier 1252. An input terminal of a charge pump unit 1255 may be coupled to the output terminal of the operational amplifier 1252. A voltage Vreg n may be at the input terminal of the charge pump unit 1255. The voltage Vreg n may be a multiple of the predetermined voltage $V_{BG}$. An output terminal of the charge pump unit 1255 may provide a voltage Vn. The voltage Vn may be a negative voltage. The charge pump unit 1255 may be a clock generator based charge pump. In the example of FIG. 13, the resistor R121 having a large resistance and the capacitor 120 having a large capacitance may be used to filter out noise generated by the clock signals of the charge pump unit 1255. However, the resistor R121 and the capacitor 120 may also reduce the rate of the operation terminal 1105 reaching the predetermined voltage $V_{BG}$, so the voltage generators and the control methods provided by embodiments may be used to accelerate the process of the voltage of the operation terminal 1105 reaching the predetermined voltage $V_{BG}$.

Figure 14:
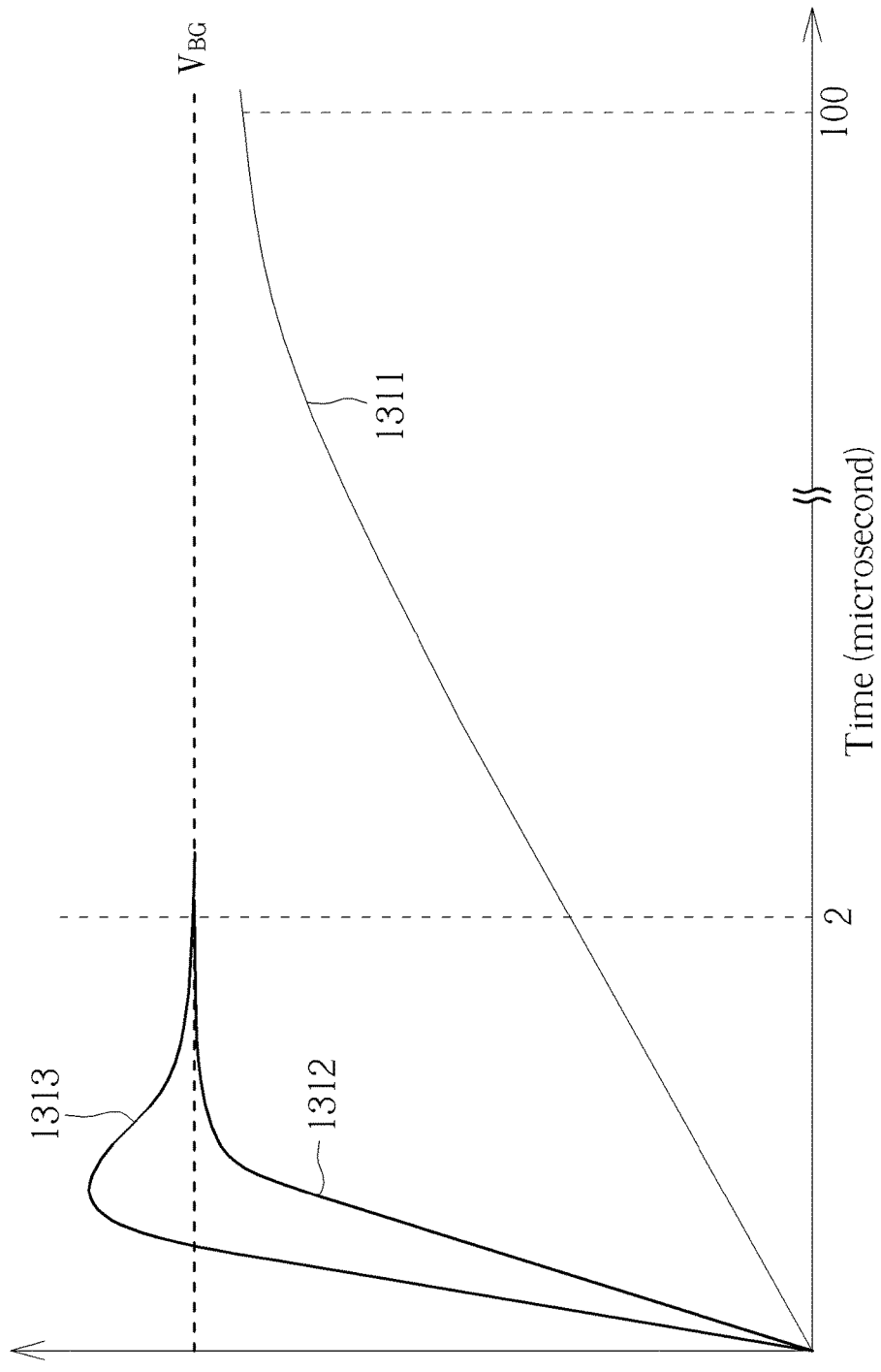
FIG. 14 illustrates the voltage at the operation terminal versus time according to an embodiment.

FIG. 14 illustrates the voltage at the operation terminal 1105 versus time according to an embodiment. A curve 1311 may represent variation of the voltage at the operation terminal 1105 without using a voltage generator and a method provided by an embodiment. Regarding the curve 1311, it requires more than 1000 microseconds for the voltage at the operation terminal 1105 to reach the predetermined voltage $V_{BG}$ (e.g. about 1.2 volt). The curves 1312 and 1313 may represent variation of the voltage at the operation terminal 1105 using a voltage generator and a method provided by an embodiment. Regarding the curve 1312, the voltage at the operation terminal 1105 is still smaller than the predetermined voltage $V_{BG}$ after being pre-charged, and the capacitor 120 may be charged afterward to allow the voltage at the operation terminal 1105 to reach the predetermined voltage $V_{BG}$. Regarding the curve 1313, the voltage at the operation terminal 1105 is larger than the predetermined voltage $V_{BG}$ after being pre-charged, and the capacitor 120 may be discharged to allow the voltage at the operation terminal 1105 to reach the predetermined voltage $V_{BG}$. Comparing the curves 1311 to 1313, it may take 2 microseconds for the voltage at the operation terminal 1105 to reach the predetermined voltage $V_{BG}$ using a voltage generator and a method according to embodiments. Hence, the waiting time may be reduced to be 1/500. The time intervals and voltage values in the foresaid case are provided as examples but not for limiting the scope of the present invention.

In summary, a voltage generator and a method provided by embodiments may reduce a time required for a voltage at the operation terminal to reach a predetermined voltage, and a resistor and a capacitor being large enough may still be used to filter out noise, so the operation rate and the signal quality may both be improved. It is beneficial for resolving a problem in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bandgap reference circuit for providing a first voltage intended to approach a predetermined voltage to a linear regulator, comprising:
   a voltage generation circuit configured to generate the first voltage and a first current at an operation terminal;
   a capacitor including a first terminal coupled to the operation terminal, and a second terminal coupled to a first reference voltage terminal;
   a clamping control circuit coupled between the operation terminal and a second reference voltage terminal, comprising:
   a first switch; and
   a clamping unit coupled to the first switch; and
   a control unit configured to control the first switch;
   wherein:
   when a difference of the first voltage at the operation terminal and the predetermined voltage is larger than a threshold, the control unit turns on the first switch so that a voltage across the clamping unit is increased, at least a portion of the first current flows to the second reference voltage terminal through the clamping unit, and the first voltage at the operation terminal approaches the predetermined voltage at a first rate; and
   when the difference of the first voltage at the operation terminal and the predetermined voltage is smaller than the threshold, the control unit turns off the first switch so that the portion of the first current stops flowing to the second reference voltage terminal through the clamping unit, and the first voltage at the operation terminal approaches the predetermined voltage at a second rate lower than the first rate.

2. The bandgap reference circuit of claim 1, further comprising:
   a second switch coupled to a source voltage terminal; and
   a current control unit coupled between the second switch and the operation terminal;
   wherein:
   the control unit is further configured to control the second switch;
   when the difference of the first voltage at the operation terminal and the predetermined voltage is larger than the threshold, the control unit turns on the second switch so as to enable a second current flowing to the operation terminal from the source voltage terminal; and
   when the difference of the first voltage at the operation terminal and the predetermined voltage is smaller than the threshold, the control unit turns off the second switch so as to terminate the second current.

3. A voltage generator comprising:
   a voltage generation circuit configured to generate a first voltage and a first current at an operation terminal wherein the first voltage is to approach a predetermined voltage;
   a capacitance device comprising a first terminal coupled to the operation terminal, and a second terminal coupled to a first reference voltage terminal; and
   a clamping control circuit coupled between the operation terminal and a second reference voltage terminal, comprising:
   a first switch; and
   a clamping unit coupled to the first switch and configured to allow a portion of the first current to flow between the operation terminal and the second reference voltage terminal through the clamping unit when the first switch is turned on;
   wherein:
   when a difference of the first voltage at the operation terminal and the predetermined voltage is larger than a threshold, a control unit turns on the first switch so that the first voltage at the operation terminal approaches the predetermined voltage at a first rate; and
   when the difference of the first voltage at the operation terminal and the predetermined voltage is smaller than the threshold, the control unit turns off the first switch so that the first voltage at the operation terminal approaches the predetermined voltage at a second rate lower than the first rate.

4. The voltage generator of claim 3, wherein the first reference voltage terminal and the second reference voltage terminal have an identical voltage.

5. The voltage generator of claim 3, further comprising:
   a current control unit configured to allow a second current to flow to the operation terminal, and comprising a first terminal coupled to a source voltage terminal, and a second terminal coupled to the operation terminal;
   wherein the second current and the portion of the first current flow through the clamping unit when the first switch is turned on.

6. The voltage generator of claim 5, wherein the current control unit comprises a resistor.

7. The voltage generator of claim 5, wherein the current control unit comprises a first transistor comprising:
   a control terminal coupled to the voltage generation circuit so that the first transistor generates the second current according to the first current.

8. The voltage generator of claim 3, further comprising:
   a current control unit comprising a first terminal and a second terminal coupled to the operation terminal; and
   a second switch coupled between a source voltage terminal and the first terminal of the current control unit, and configured to allow a second current to flow to the operation terminal through the second switch when the second switch is turned on;
   wherein the second current and the portion of the first current flow through the clamping unit when the first switch and the second switch are turned on.

9. The voltage generator of claim 8, wherein the first switch and the second switch are turned on at the same time.

10. The voltage generator of claim 8, wherein the first switch and the second switch are turned off at the same time.

11. The voltage generator of claim 8, wherein a time of turning on the second switch is corresponding to whether a difference of the first voltage at the operation terminal and the predetermined voltage is larger than a threshold.

12. The voltage generator of claim 3, wherein:
   the clamping unit comprises n diodes; the first switch comprises a first terminal coupled to the operation terminal and a second terminal; an anode of a first diode of the n diodes is coupled to the second terminal of the first switch; a cathode of an $n_{th}$ diode of the n diodes is coupled to the second reference voltage terminal; and n is a positive integer.

13. The voltage generator of claim 3, wherein:
   the clamping unit comprises n diodes; an anode of a first diode of the n diodes is coupled to the operation terminal; the first switch comprises a first terminal coupled to a cathode of an $n_{th}$ diode of the n diodes, and a second terminal coupled to the second reference voltage terminal; and n is a positive integer.

14. The voltage generator of claim 3, wherein:
   the first switch comprises a first terminal and a second terminal;

the clamping unit comprises:
a first set of diodes comprising m diodes; and
a second set of diodes comprising n diodes;
an anode of a first diode of the first set of diodes is coupled to the operation terminal; the first terminal of the first switch is coupled to a cathode of an $m_{th}$ diode of the first set of diodes; an anode of a first diode of the second set of diodes is coupled to the second terminal of the first switch; and a cathode of an $n_{th}$ diode of the second set of diodes is coupled to the second reference voltage terminal; and m and n are positive integers.

15. The voltage generator of claim 3, wherein a time of turning on the first switch is corresponding to whether a difference of the first voltage at the operation terminal and the predetermined voltage is larger than a threshold.

16. A voltage control method used on a voltage generator, the voltage generator comprising a voltage generation circuit, a capacitance device and a clamping control circuit; the clamping control circuit comprising a first switch and a clamping unit; the voltage generation circuit comprising an operation terminal, the capacitance device comprising a first terminal coupled to the operation terminal; the clamping control circuit being coupled to the operation terminal; the method comprising:
generating a first current and a first voltage at the operation terminal by the voltage generation circuit wherein the first voltage is to approach a predetermined voltage;
turning on the first switch so that a portion of the first current flows through the clamping unit; and
turning off the first switch to charge or discharge the capacitance device to adjust the first voltage at the operation terminal;
wherein:
when turning on the first switch, the first voltage at the operation terminal approaches the predetermined voltage at a first rate; and
when turning off the first switch, the first voltage at the operation terminal approaches the predetermined voltage at a second rate lower than the first rate.

17. The method of claim 16, wherein the voltage control circuit further comprises a current control unit comprising a first terminal coupled to a source voltage terminal, and a second terminal coupled to the operation terminal, and the method further comprises:
outputting a second current to the clamping unit by the current control unit so that a current flowing through the clamping unit increases to be a sum of the second current and the portion of the first current.

18. The method of claim 16, wherein the voltage control circuit further comprises a current control unit and a second switch; the current control unit comprises a first terminal and a second terminal coupled to the operation terminal, the second switch comprises a first terminal coupled to a source voltage terminal and a second terminal coupled to the first terminal of the current control unit; and the method further comprises:
turning on the second switch so that the current control unit outputs a second current to the clamping unit, and a current flowing through the clamping unit increases to be a sum of the second current and the portion of the first current.

* * * * *